(12) United States Patent
Hayasi et al.

(10) Patent No.: US 8,764,209 B2
(45) Date of Patent: Jul. 1, 2014

(54) LIGHT MODULE

(75) Inventors: Sintarou Hayasi, Kobe (JP); Osamu Tanahasi, Kyotanabe (JP); Satosi Fukano, Ikoma (JP); Shinichi Anami, Hirakata (JP); Shigetsugu Sumiyama, Hirakata (JP); Motohiro Saimi, Takarazuka (JP); Hideharu Kawachi, Kobe (JP)

(73) Assignee: Panasonic Corporation, Osaka (JP)

( * ) Notice: Subject to any disclaimer, the term of this patent is extended or adjusted under 35 U.S.C. 154(b) by 373 days.

(21) Appl. No.: 12/883,504

(22) Filed: Sep. 16, 2010

(65) Prior Publication Data

US 2011/0069495 A1 Mar. 24, 2011

(30) Foreign Application Priority Data

Sep. 18, 2009 (JP) .................................. 2009-216557

(51) Int. Cl.
*F21K 2/00* (2006.01)
(52) U.S. Cl.
USPC ............................................................ 362/34
(58) Field of Classification Search
USPC ............................................................ 362/34
See application file for complete search history.

(56) References Cited

U.S. PATENT DOCUMENTS

| 2002/0030445 | A1 | 3/2002 | Fukasawa |
| 2004/0051172 | A1* | 3/2004 | Miyazaki et al. ............. 257/706 |
| 2008/0231180 | A1 | 9/2008 | Waffenschmidt et al. |
| 2009/0096362 | A1 | 4/2009 | Diekmann et al. |
| 2009/0162617 | A1 | 6/2009 | Moroishi et al. |
| 2009/0309213 | A1* | 12/2009 | Takahashi et al. ............ 257/707 |

FOREIGN PATENT DOCUMENTS

| DE | 10315417 | 11/2004 |
| JP | 61-201291 | 9/1986 |
| JP | 2006-049057 | 2/2006 |
| JP | 2007-299740 | 11/2007 |
| JP | 2008-243803 | 10/2008 |
| JP | 2009-88515 | 4/2009 |
| JP | 2009-158103 | 7/2009 |
| KR | 10-2007-0050800 | 5/2007 |
| KR | 2008-0032834 | 4/2008 |

OTHER PUBLICATIONS

E.P.O. Office action, mail date is Sep. 10, 2012.
EPO Official Action dated Jul. 12, 2013.

\* cited by examiner

*Primary Examiner* — William Carter
(74) *Attorney, Agent, or Firm* — Greenblum & Bernstein, PLC

(57) ABSTRACT

A light module 1 includes a planar light emitting device 2, a wiring board 3, and an optical sheet 4. The wiring board 3 has a hole 8 for accommodating the planar light emitting device 2. The optical sheet 4 holds the planar light emitting device 2 and the wiring board 3 such that the planar light emitting device 2 accommodated in the hole 8 of the wiring board 3 and the wiring board 3 are flush with each other on the light emitting surface side of the light module 1. The optical sheet 4 holds the planar light emitting device 2 and the wiring board 3, and prevents dust and moisture from entering the inside the light module 1. This eliminates the necessity for the light module 1 to include a casing, packing, and the like. Therefore, the thickness of the module can be reduced.

4 Claims, 4 Drawing Sheets

LIGHT EMISSION

LIGHT EMISSION

ture from entering the inside of the module. This eliminates the necessity for the light module to include a casing, packing, and the like. Therefore, the thickness of the light module can be reduced.

LIGHT MODULE

BACKGROUND OF THE INVENTION

1. Field of the Invention

The present invention relates to a light module that includes an organic electroluminescence light emitting device (hereinafter, referred to as an organic EL light emitting device) and that is used in lighting equipment, LCD backlights, various display apparatuses, and the like.

2. Description of the Background Art

Conventionally, there are known light modules that include a planar light emitting device that is an organic EL light emitting device (see, for example, Japanese Laid-open Patent Publication No. 2007-299740). FIG. 6 shows a structure of such a light module (a light module 101). The light module 101 includes: a planar light emitting device 102; a wiring board 103 for feeding power to the planar light emitting device 102; an optical sheet 104 provided on the light emitting surface of the planar light emitting device 102; a power feeding connecting member 105 for electrically connecting electrodes of the planar light emitting device 102 and a wiring pattern (not shown) of the wiring board 103; and a casing 106 for accommodating these components.

The optical sheet 104 adjusts the distribution and the refractive index of light emitted from the planar light emitting device 102. The power feeding connecting member 105 is formed as a copper lead frame, flexible wiring board, or the like. The casing 106 has an opening 107 for letting out the light emitted from the planar light emitting device 102.

In the light module 101 having the above configuration, a gap is likely to occur at the position of a step formed by the opening 107 of the casing 106 and the optical sheet 104. Therefore, dust or moisture is likely to enter the inside of the module through the gap. Packing or the like may be provided to seal the gap for the purpose of preventing the dust and moisture from entering the inside of the module. This, however, makes it difficult to reduce the thickness of the module. As a result, the feature of the planar light emitting device 102, i.e., being a thin planar light source, cannot be taken advantage of.

SUMMARY OF THE INVENTION

The present invention is devised to solve the above problems. An object of the present invention is to provide a light module with a reduced thickness that is capable of preventing dust and moisture from entering the inside of the module.

In order to achieve the above object, a first aspect of the present invention is a light module including a planar light emitting device. The light module includes: a wiring board on which a wiring pattern for feeding power to the planar light emitting device is formed; and a drip-proof optical sheet, provided on a light emitting surface of the planar light emitting device, for adjusting distribution of light emitted from the planar light emitting device. The planar light emitting device is accommodated in a hole that is formed in the wiring board. The planar light emitting device accommodated in the hole of the wiring board and the wiring board are fixed on the optical sheet in a manner that the planar light emitting device and the wiring board are flush with each other at the light emitting surface side of the light module, such that the optical sheet covers, at the light emitting surface side of the light module, the planar light emitting device and a boundary formed between the planar light emitting device and the wiring board.

Accordingly, the optical sheet holds the planar light emitting device and the wiring board, and prevents dust and moisture from entering the inside of the module. This eliminates the necessity for the light module to include a casing, packing, and the like. Therefore, the thickness of the light module can be reduced.

In a second aspect of the present invention, electrodes of the planar light emitting device and the wiring pattern of the wiring board may be electrically connected by aluminum wires, and the aluminum wires may be clad with an ultraviolet curable resin.

Accordingly, the planar light emitting device is fed with power via the aluminum wires. This eliminates the necessity for the light module to include a power feeding connecting member such as a flexible wiring board. This reduces the manufacturing cost. Moreover, since the aluminum wires are clad with the ultraviolet curable resin, the insulation properties, robustness, and moisture resistance are improved at room temperature and at low cost. Thus, the aluminum wires can be protected from mechanical stress, moisture, and corrosion due to gases.

In a third aspect of the present invention, the wiring board and the optical sheet may have the same external shape.

In a fourth aspect of the present invention, multiple portions of the wiring board that are arranged on the optical sheet may form the hole of the wiring board for accommodating the planar light emitting device.

In a fifth aspect of the present invention, the planar light emitting device and the wiring board may be bonded onto the optical sheet by an adhesive.

In a sixth aspect of the present invention, opposite side surfaces of the planar light emitting device and the wiring board to which a surface that the optical sheet is placed on, may be painted.

DESCRIPTION OF THE PREFERRED EMBODIMENTS

Figure 1:
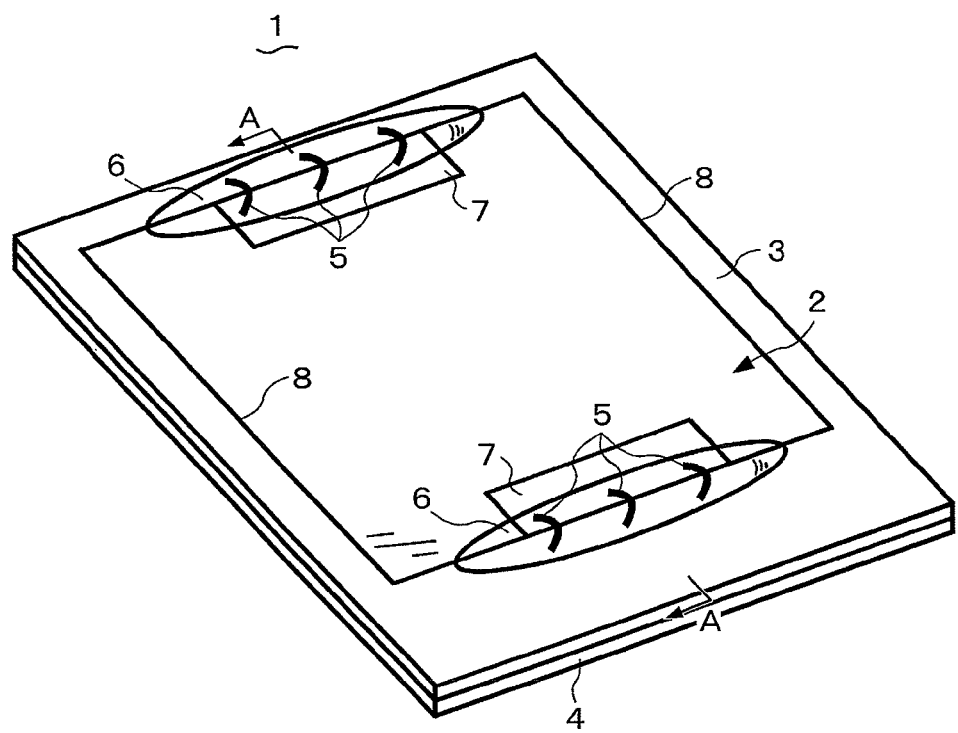
FIG. 1 is an external view of a light module according to an embodiment of the present invention.
Figure 2:
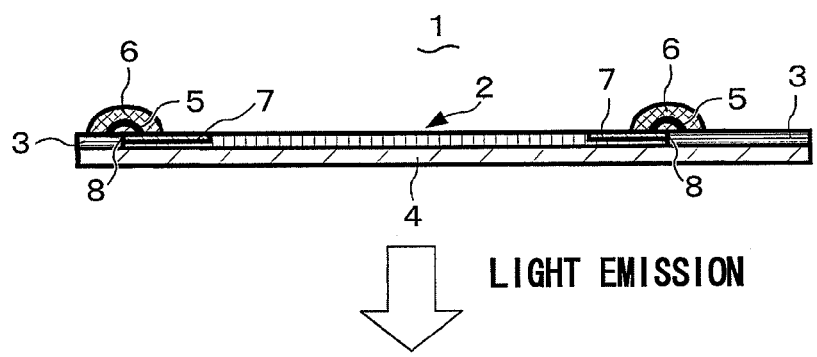
FIG. 2 is a sectional side view of the light module cut along a line A-A.

FIG. 1 to FIG. 4 each show a structure of a light module 1 according to an embodiment of the present invention. As shown in FIG. 1 and FIG. 2, the light module 1 includes: a planar light emitting device 2; a wiring board 3 for feeding power to the planar light emitting device 2; an optical sheet 4 provided on the light emitting surface of the planar light emitting device 2; aluminum wires 5 provided on the planar light emitting device 2 and the wiring board 3; and an ultraviolet curable resin 6 for sealing and thereby insulating the aluminum wires 5. The planar light emitting device 2 has electrodes 7 connected to the aluminum wires 5. The wiring board 3 has a hole 8 for accommodating the planar light emitting device 2. The light module 1 is used in such a manner that the light module 1 is incorporated into lighting equipment that includes a structure for holding the light module 1 and includes a DC power source for feeding power to the light module 1.

For example, the planar light emitting device 2 is formed in the following manner: indium tin oxide that is a transparent electrode and that acts as an anode, organic matter that acts as luminescent materials, aluminum that acts as a cathode, and a hygroscopic layer and a sealing layer for protecting the organic matter, are laminated in said order on a rectangular alkali-free glass substrate having the size of 80 mm×80 mm×0.7 mm. The organic matter emits light when a voltage is applied between the anode and the cathode of the planar light emitting device 2. The light is reflected by the aluminum of the cathode, and then let out from the light emitting surface.

The electrodes 7 of the planar light emitting device 2 are formed by sputtering molybdenum/aluminum/molybdenum onto the anode and the cathode of the planar light emitting device 2. The electrodes 7 are each formed as a rectangular pad having the size of 2 mm×19 mm, for example. Two electrodes 7 are provided at two facing sides of the planar light emitting device 2, respectively. Note that three electrodes 7 may be provided at three sides of the planar light emitting device 2, respectively, or four electrodes 7 may be provide at four sides of the planar light emitting device 2, respectively. By increasing the number of electrodes 7 provided on the planar light emitting device 2 in such a manner, multiple feeding points for feeding power to the luminescent materials are obtained. This prevents a voltage drop from occurring at the anode due to the high resistance of indium tin oxide that forms the anode. As a result, light emission unevenness is reduced. Thus, an even light emission can be realized.

A wiring pattern (not shown) for feeding power to the planar light emitting device 2 is formed on the wiring board 3. The wiring board 3 includes, for example, an FR-4 board having the size of 20 mm×80 mm×0.5 mm, copper wiring, and components forming a power supply circuit. The thickness of the wiring board 3 including the components forming the power supply circuit is 4 mm. Note that the wiring board 3 may include an IC for controlling the lighting of the light module 1. The IC may have: a DC/DC conversion function for enabling the use of multiple light modules 1 that are arranged alongside of each other; an address control function for controlling, in the case of using multiple light modules 1 that are arranged alongside of each other, the lighting of the light modules 1 to be partially ON/OFF; and a PWM control function for adjusting the dimming of the light modules 1. Further, the wiring board 3 may include a connector for power feeding and screw holes for fixing the light module 1 to lighting equipment, a wall, a ceiling, or the like.

The size of the hole 8 of the wiring board 3 allows the planar light emitting device 2 to be accommodated in the hole 8. Around the hole 8, bonding pads that form part of the wiring pattern are arranged for enabling ultrasonic bonding between the aluminum wires 5 and the wiring pattern. Each bonding pad has the size of 1 mm×1 mm, for example. The bonding pads are formed by flash gold plating. Silk patterns are printed around the bonding pads in order to limit the spreading of the ultraviolet curable resin 6 that has been applied. Note that the wiring board 3 may be a build-up wiring board without through holes. The design of the light module 1 that includes a build-up wiring board may be improved by painting, using any color, the surface of the wiring board 3 that is opposite to the surface, of the wiring board 3, on which the optical sheet 4 is placed. It is desired that waterproof paint is used for painting the surface.

The optical sheet 4 is formed of an acrylic resin and has the same size as that of the wiring board 3. The optical sheet 4 is cut in accordance with the shapes of the screw holes and the connector. The optical sheet 4 is drip proof and dust proof. By means of the optical sheet 4, the refractive index is adjusted to increase the amount of light to be extracted and to control the distribution of light. The optical sheet 4 holds the planar light emitting device 2 and the wiring board 3 by means of an adhesive, such that the wiring board 3 and the planar light emitting device 2 accommodated in the hole 8 of the wiring board 3 are flush with each other on the light emitting surface side. The optical sheet 4 covers the planar light emitting device 2 and a boundary formed between the planar light emitting device 2 and the wiring board 3. Note that, in the case where the optical sheet 4 is required to have weather resistance or sufficient strength, the optical sheet 4 may be formed of a glass sheet, an acrylic sheet, or the like. Further, the optical sheet 4 may be formed to have a size different from that of the wiring board 3 so long as the optical sheet 4 covers the planar light emitting device 2 and a boundary formed between the planar light emitting device 2 and the wiring board 3.

Figure 6:
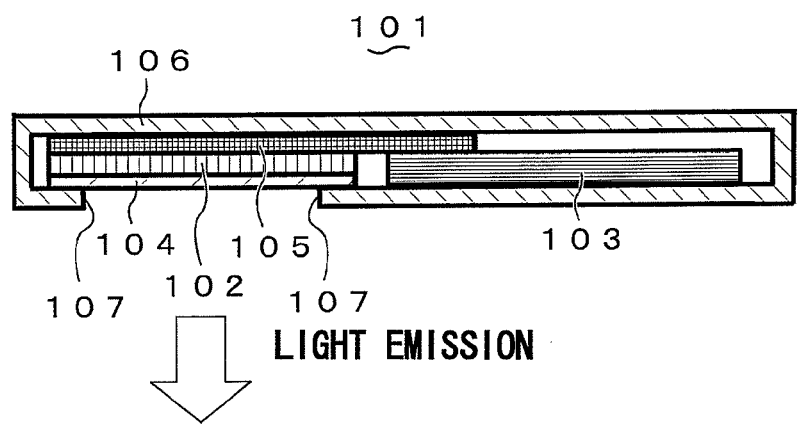
FIG. 6 is a sectional side view of a conventional light module.

Referring to FIG. 6, in the case where the power feeding connecting member 105 is a lead frame, it is necessary for the lead frame to contact the electrodes of the planar light emitting device 102 in a stable manner. However, it is difficult to join the lead frame and the electrodes of the planar light emitting device 102 at low temperature. Therefore, usually, the casing 106 is used to provide mechanical retention of the lead frame to the planar light emitting device 102. This makes it more difficult to reduce the thickness of the module. Furthermore, since the lead frame does not have insulation properties, a metal heat sink for reinforcing the heat dissipation capacity of the planar light emitting device 102 cannot be disposed near the lead frame.

In the case where the power feeding connecting member 105 is a flexible wiring board, the flexible wiring board can be joined to the electrodes of the planar light emitting device 102 by means of an anisotropic conductive film or the like. However, organic matter that forms luminescent materials in the planar light emitting device 102 has low heat resistance. Therefore, the luminescent materials in the planar light emitting device 102 are likely to be damaged due to the joining of the electrodes of the planar light emitting device 102 to the flexible wiring board, which joining is performed with application of heat of high temperature such as 150° C. Moreover, the material cost for the flexible wiring board and the anisotropic conductive film is higher than the material cost for the lead frame. This results in a cost increase.

On the contrary, according to the present embodiment, the aluminum wires 5 are formed of pure aluminum. In order to improve the mechanical strength of the aluminum wires 5 and increase the amount of current applicable to the aluminum wires 5, the aluminum wires 5 are formed as, for example, thick wires having the diameter of 200 μm or greater, or ribbon wires having the thickness of 200 μm or greater and the width of 2 mm or greater. The aluminum wires 5 are provided on the surfaces of the planar light emitting device 2 and the wiring board 3 that are opposite to the surfaces, of the planar light emitting device 2 and the wiring board 3, on which the optical sheet 4 is placed. The aluminum wires electrically connect the electrodes 7 of the planar light emitting device 2 and the bonding pads which form part of the wiring pattern of the wiring board 3. The connection of the aluminum wires 5 with the electrodes 7 and the bonding pads may be formed by ultrasonic bonding, which allows the bonding to be performed at room temperature and at low cost and with which a highly reliable electrical connection can be formed.

The ultraviolet curable resin 6 is used to clad the aluminum wires 5 with the cladding thickness of, for example, 100 μm or greater. The ultraviolet curable resin 6 is cured when being irradiated with an ultraviolet ray. Note that a fear of short circuit in the light module 1 due to a contact with a metal is eliminated since the aluminum wires 5 are insulated by the ultraviolet curable resin 6. Accordingly, a heat sink for dissipating heat of the planar light emitting device 2, a decorative laminate for improving the design of the light module 1, or the like may be placed on the surface of the planar light emitting device 2 that is opposite to the light emitting surface of the planar light emitting device 2.

Figure 3:
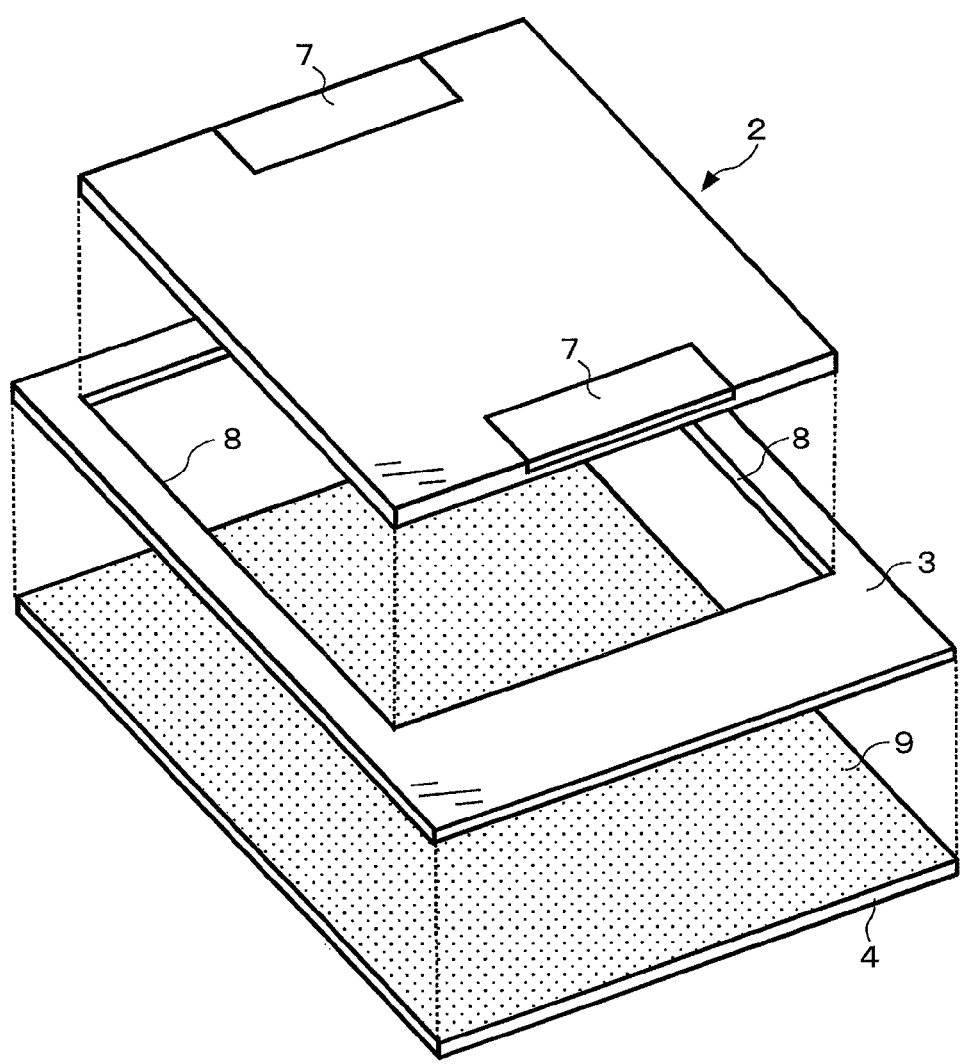
FIG. 3 is an exploded view of the light module.

Hereinafter, assembling of the light module 1 is described with reference to FIG. 3 and FIG. 4. Referring to FIG. 3, an adhesive 9 is applied to one surface of the optical sheet 4, which is hereinafter referred to as a top surface. The wiring board 3 is placed and bonded onto the top surface of the optical sheet 4 with the adhesive 9. Then, the planar light emitting device 2 with its light emitting surface facing downward is inserted into the hole 8 of the wiring board 3 to be placed and bonded onto the top surface of the optical sheet 4 with the adhesive 9.

Figure 4:
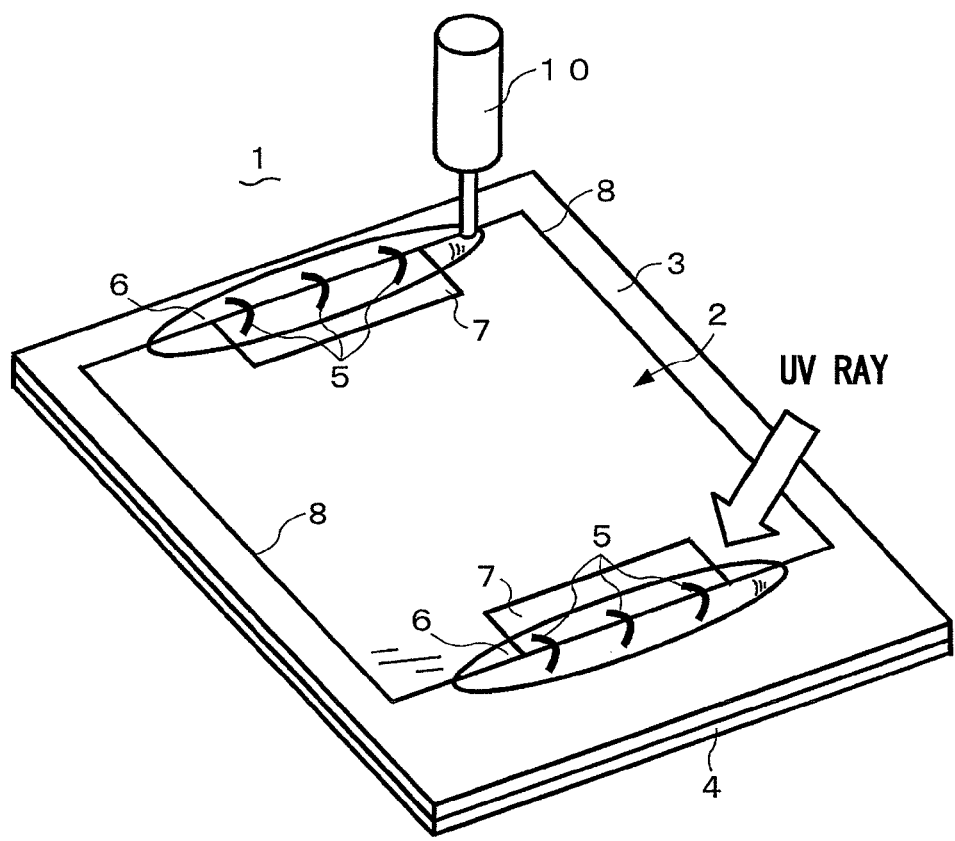
FIG. 4 is a perspective view showing a process in which an ultraviolet curable resin is applied to the light module and cured by an ultraviolet ray.

Next, referring to FIG. 4, the electrodes 7 of the planar light emitting device 2 and the bonding pads of the wiring board 3 are electrically connected, via aluminum wires 5, by ultrasonic bonding using an ultrasonic wire bonder. Then, the ultraviolet curable resin 6 is applied by a resin applying apparatus 10 to clad the aluminum wires 5 with the ultraviolet curable resin 6. Subsequently, the ultraviolet curable resin 6 is irradiated with an ultraviolet ray and thereby cured. In this manner, the light module 1 is completed. Note that if the number of electrodes 7 provided in the planar light emitting device 2 is three or more, the electrodes 7 that are of the same polarity are electrically connected by aluminum wires 5.

In the light module 1 having the above structure, the optical sheet 4 holds the planar light emitting device 2 and the wiring board 3, and prevents dust and moisture from entering the inside of the module. This eliminates the necessity for the light module 1 to include a casing, packing, and the like. Therefore, the thickness of the light module 1 can be reduced. Since the planar light emitting device 2 is fed with power via the aluminum wires 5, it is not necessary for the light module 1 to include a power feeding connecting member such as a flexible wiring board. This reduces the manufacturing cost. Moreover, since the aluminum wires 5 are clad with the ultraviolet curable resin 6, the insulation properties, robustness, and moisture resistance are improved at room temperature and at low cost. Thus, the aluminum wires 5 can be protected from mechanical stress, moisture, and corrosion due to gases.

Figure 5:
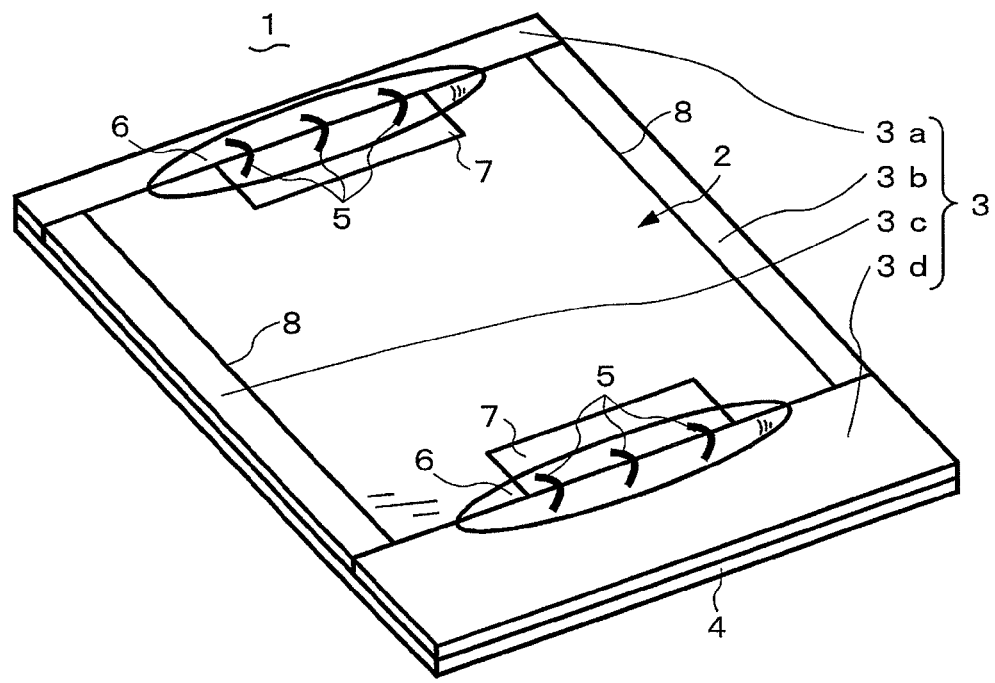
FIG. 5 is an external view showing a variation of the light module.

FIG. 5 shows the light module 1 according to a variation of the present embodiment. In the light module 1 of the variation, four rectangular members 3a, 3b, 3c, and 3d form the wiring board 3. Other than this, the structure of the light module 1 of the variation is the same as in the above-described embodiment. As for the light module 1 of the variation, the hole 8 of the wiring board 3 is formed not by cutting out part of a material board of the wiring board 3 in accordance with the shape of the hole 8, but by combining the four rectangular members 3a to 3d. In this manner, a cut out piece of the material board, which is a waste, is not produced. Thus, the manufacturing cost is reduced.

The present invention is not limited to the above-described embodiment. Various modifications can be made without departing from the scope of the invention. For example, although the above embodiment describes a structure in which a single planar light emitting device is accommodated in the hole of the wiring board, a plurality of planar light emitting devices may be accommodated in the hole of the wiring board. The present application is based on Japanese Patent Application No. 2009-216557, the disclosure of which is incorporated herein by reference.

What is claimed is:

1. A light module including a planar light emitting device, comprising:
    a wiring board having a wiring pattern for feeding power to the planar light emitting device; and
    a drip-proof optical sheet, provided on a light emitting surface of the planar light emitting device, for adjusting distribution of light emitted from the planar light emitting device, wherein
    the planar light emitting device is accommodated in a hole defined by the wiring board,
    the planar light emitting device and the wiring board are bonded to the optical sheet by an adhesive and wholly covered by the optical sheet in a manner such that the planar light emitting device and the wiring board are flush with each other on a light emitting surface side of the light module, such that the optical sheet covers, at the light emitting surface side of the light module, the planar light emitting device and a gap between the planar light emitting device and the wiring board,
    electrodes of the planar light emitting device and the wiring pattern of the wiring board are electrically connected by aluminum wires, and
    the aluminum wires are clad with an ultraviolet curable resin.

2. The light module according to claim 1, wherein the wiring board and the optical sheet have the same external shape.

3. The light module according to claim 2, wherein multiple portions of the wiring board that are arranged on the optical sheet define the hole of the wiring board for accommodating the planar light emitting device.

4. A light module including a planar light emitting device, comprising
    a wiring board having a wiring pattern for feeding power to the planar light emitting device; and
    a drip-proof optical sheet, provided on a light emitting surface of the planar light emitting device, for adjusting distribution of light emitted from the planar light emitting device, wherein
    the planar light emitting device is accommodated in a hole defined by the wiring board,
    the planar light emitting device and the wiring board are bonded to the optical sheet by an adhesive and wholly covered by the optical sheet in a manner such that the planar light emitting device and the wiring board are flush with each other on a light emitting surface side of the light module, such that the optical sheet covers, at the light emitting surface side of the light module, the planar light emitting device and a gap between the planar light emitting device and the wiring board, and
    opposite side surfaces of the planar light emitting device and the wiring board to which a surface that the optical sheet is placed on, are painted.

* * * * *